United States Patent
Watanabe et al.

(10) Patent No.: US 6,562,646 B2
(45) Date of Patent: May 13, 2003

(54) METHOD FOR MANUFACTURING LIGHT-EMITTING DEVICE USING A GROUP III NITRIDE COMPOUND SEMICONDUCTOR

(75) Inventors: Hiroshi Watanabe, Aichi (JP); Naoki Shibata, Aichi (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 0 days.

(21) Appl. No.: 09/863,514

(22) Filed: May 24, 2001

(65) Prior Publication Data
US 2002/0004252 A1 Jan. 10, 2002

(30) Foreign Application Priority Data
May 24, 2000 (JP) .......................................... 2000-152991

(51) Int. Cl.[7] .......................... H01L 21/00; H01L 21/28; H01L 21/3205
(52) U.S. Cl. .............................. 438/31; 438/46; 438/604
(58) Field of Search ........................ 438/604, 29, 31, 438/37, 46, 47, 602

(56) References Cited

U.S. PATENT DOCUMENTS

| | | | |
|---|---|---|---|
| 5,656,832 A | * | 8/1997 | Ohba et al. ............... 257/190 |
| 5,700,713 A | | 12/1997 | Yamazaki et al. |
| 5,777,350 A | | 7/1998 | Nakamura et al. |
| 5,945,689 A | | 8/1999 | Koike et al. |
| 5,959,307 A | | 9/1999 | Nakamura et al. |
| 5,993,542 A | * | 11/1999 | Yanashima et al. ........... 117/84 |

* cited by examiner

Primary Examiner—William David Coleman
(74) Attorney, Agent, or Firm—McGinn & Gibb, PLLC

(57) ABSTRACT

A method for manufacturing a light-emitting device which using group III nitride group semiconductors and a quantum well structure, comprising forming a well layer (e.g. an InGaN layer), forming a cap layer on the well layer, the cap layer having almost the same compositions as the well layer at a temperature similar to that at which the well layer was formed. Further, and the cap layer is formed at a crystal growth rate which is faster than the crystal growth rate of the well layer and removing the cap layer using a thermal cracking (or decomposition) process during the temperature ramp up associated with the formation of the next group III nitride compound semiconductor layer. After the cap layer is removed, the group III nitride compound semiconductor layer is formed on the exposed well layer.

37 Claims, 2 Drawing Sheets

STATE AFTER FORMING A CAP LAYER

AFTER TEMPERATURE RAISING PROCESS FOR FORMING A BARRIER LAYER

BARRIER LAYER IS FORMED AND QUANTUM WELL STRUCTURE IS COMPLETED

METHOD FOR MANUFACTURING LIGHT-EMITTING DEVICE USING A GROUP III NITRIDE COMPOUND SEMICONDUCTOR

This is a patent application based on a Japanese patent application No. 2000-152991 which was filed on May 24, 2000 and which is incorporated herein by reference.

BACKGROUND OF THE INVENTION

1. Field of the Invention

The present invention relates to a method for manufacturing a light-emitting device (LED, LD, etc.) using a group III nitride compound semiconductor, which has a multiple quantum well (MQW) structure.

2. Description of the Related Art

A conventional method for manufacturing a light-emitting device using a group III nitride compound semiconductor and a quantum well structure, comprises the steps of forming a well layer; forming a cap layer, whose band gap is wider than that of the well layer and whose band gap is the same as or narrower than that of the barrier layer at the same temperature at which the well layer is formed; removing the cap layer by thermal cracking (or decomposition) caused by raising the temperature of the substrate at which the barrier layer is formed; and forming a barrier layer on the well layer is well known.

One goal of this conventional method was to prevent the well layer from subliming during the barrier layer formation and thereby both prevent an unnecessary luminous center and improve luminous efficiency. Because sublimation of the well layer can be prevented and the barrier layer can be formed on the well layer by utilizing this conventional method, each well layer typically has an uniform thickness, which enables the well layers to maintain excellent crystallinity.

In fact, this conventional method can more than double the luminous efficiency of the semiconductor LED of a group III nitride compound semiconductor light-emitting device manufactured using earlier manufacturing methods at similar wavelength under equivalent driving voltage and electric current conditions.

However, problems remain in the application of the conventional method. Specifically, in order to form a cap layer which has both a wider band gap than a well layer and the same or a narrower band gap than a barrier layer in the conventional LED, the well layer and the cap layer generally comprise semiconductor layers of quite different composition. These compositions differences result in severe concentration gradients for some components such as indium (In) at the boundary region between the well layer and the cap layer in the conventional device. Futher, because of this severe concentration gradient, some portion of the components present in comparatively high concentration, e.g., indium (In), will diffuse into the adjacent lower concentration region when the substrate temperature is raised during formation of the cap layer and/or the barrier layer. This diffusion prevents the formation of a well layer near an interface between the well layer and the cap layer that exhibits the most desirable composition and crystallinity.

These difficulties associated with the convention process made it difficult to form a satisfactory steep hetero interface between the well layer and the barrier layer in a conventional LED. As a result, the conventional LED could not obtain an efficient luminous efficiency.

SUMMARY OF THE INVENTION

Accordingly, in light of the above problems, an object of the present invention is to form a well layer having a high degree of crystallinity and thereby to obtain a light-emitting semiconductor device (such as an LED or a laser) having high luminous efficiency by preventing exchange and diffusion of semiconductor components, e.g., indium (In), existing between the well layer (emission layer) and the cap layer during the process of forming the cap layer or during subsequent high temperature processes.

In order to achieve above object, a first aspect of the present invention is a method for manufacturing a LED, which uses group III nitride compound semiconductor and has a quantum well structure, comprising: forming a well layer; forming a cap layer on the well layer which has almost the same compositions as the well layer and comprising group III nitride compound semiconductor around the temperature at which the well layer is formed and at growth rate v (>u) which is faster than crystal growth rate u of the well layer; eliminating at least a portion of the cap layer by using thermal cracking (or thermal decomposition) during a thermal process during which the temperature is raised for forming a subsequent group III nitride compound semiconductor layer; and forming the group III nitride compound semiconductor layer. Here composition of the cap layer may be identical to the composition of the well layer.

A second aspect of the present invention is to adjust the growth rate v of the cap layer to be about 1.5 times to 5 times larger than the crystal growth rate u of the well layer.

A third aspect of the present invention is to form the well layer using $Al_{(1-x1-y1)}Ga_{y1}In_{x1}N$ (where $0.05 \leq x1 \leq 0.50$, $0 \leq y1$, $x1+y1 \leq 1$). For example, $Ga_{y1}In_{x1}N$ (x1+y1=1) and $Al_{(1-x1-y1)}In_{x1}N$ (y1=0) properly are included.

A fourth aspect of the present invention is to form the well layer using $Ga_{(1-x1)}In_{x1}N$ (where $0.05 \leq x1 \leq 0.50$).

A fifth aspect of the present invention is to form the cap layer using $Al_{(1-x2-y2)}Ga_{y2}In_{x2}N$ (where $0.07 \leq x2 \leq 0.60$, $0 \leq y2$, $x2+y2 \leq 1$).

A sixth aspect of the present invention is to form the cap layer using $Ga_{(1-x2)}In_{x2}N$ (where $0.07 \leq x2 \leq 0.60$).

A seventh aspect of the present invention is to adjust indium composition ratio x2 of the cap layer to be larger than indium composition ratio x1 of the well layer.

An eighth aspect of the present invention is to form a cap layer having a porous structure in which the atomic vacancies are scattered.

A ninth aspect of the present invention is to form a cap layer having a thickness which is completed to be eliminated till the next layer of the group III nitride group compound semiconductor is started to be formed.

A tenth aspect of the present invention is to adjust the growth rate v of the cap layer to be more than 10 Å/min.

An eleventh aspect of the present invention is to adjust the growth rate v of the cap layer to be in a range of 15 Å/min. to 30 Å/min.

DETAILED DESCRIPTION OF THE PREFERRED EMBODIMENT

Figure 1:
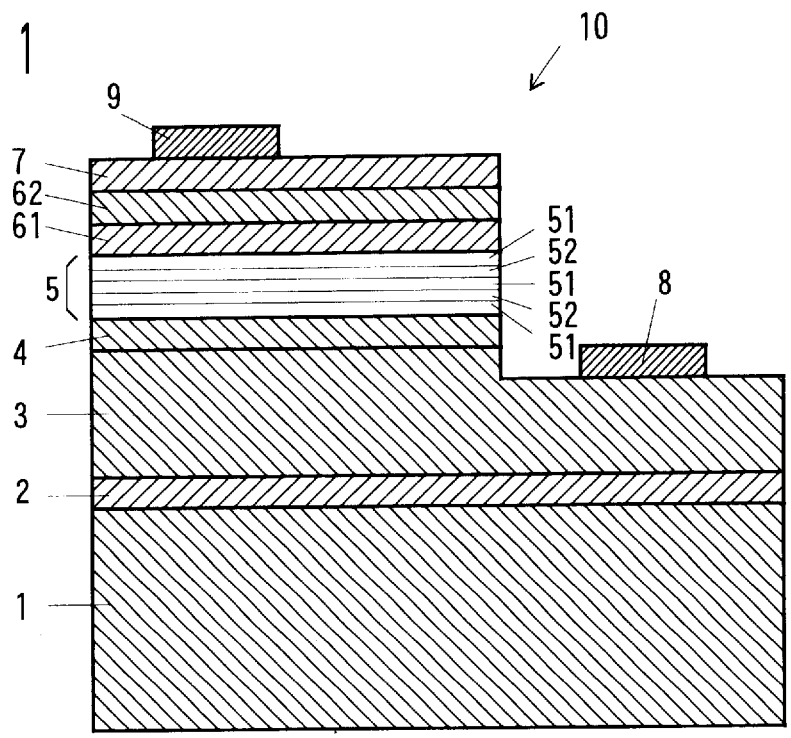
FIG. 1 is a sectional view showing a structure of a light-emitting device manufactured by a method of the present invention.

In the present invention, the cap layer is formed by using a semiconductor layer which has a composition almost the same as the composition of the underlying well layer. Because of the similarity in composition between the layers, a severe concentration gradient for components of the compositions, e.g., indium (In), is never generated near the interface of the cap layer and the well layer. The absence of a gradient minimizes or prevents transfer of the components, such as diffusion of indium, between the two layers. As a result, the well layer composition, especially that portion existing near the cap layer, is not degraded thereby maintaining a desirable crystal composition.

Although a mechanism of forming the cap layer at a growth rate v faster than the growth rate u of the well layer (v>u) will be described in more detail below, a cap layer according to the invention may be formed as follows.

When the cap layer is formed at a growth rate v greater than the growth rate u of the well layer, the resulting cap layer may have a rougher crystallinity than the well layer. The cap layer may also contain many atomic vacancies at a microscopic level, however, may exhibit a quasi-single crystal structure with a moderately homogeneous porosity at a mesoscopic level. Unlike a true semiconductor single crystal having excellent crystallinity, the cap layer according to the present invention may be cracked using a thermal process. This thermal cracking (or decomposition) process demonstrates good uniformity, and is generally independent of the actual semiconductor compositions (ratios of In, Ga, Al, etc.) of the cap layer under treatment. In short, the cap layer may be thermally cracked with little variation in the reaction rate among different compositions. As a result, the cap layer of the present invention may be removed uniformly from the well layer.

For example, by designing the thickness of the cap layer a suitable value so that the cap layer is eliminated almost completely as the temperature is increased for the formation of the next group III nitride compound semiconductor layer, the well layer can maintain a substantially unchanged composition. As a result, a well layer having both desirable composition and crystallinity can be obtained.

The method of the present invention allows the formation of a steep hetero interface for improving the luminous efficiency of the resulting light-emitting semiconductor device.

Growth rate v of the cap layer is preferably 1.5 to 5 times greater than the crystal growth rate u of the well layer. More preferably, the growth rate v of the cap layer may be 2 to 3 times greater than the crystal growth rate u of the well layer. When growth rate v is too small, the crystallinity of the resulting cap layer is too high and its crystal structure becomes too strong. If the crystal structure is too strong, subsequent thermally processing to induce thermal cracking (or decomposition) of the cap layer becomes highly dependent on the semiconductor composition (the presence and ratio of components In, Ga, N, Al, etc.). As a result, the thermal cracking (or decomposition) process for removing the cap layer can become non-uniform.

For example, when growth rate v of a cap layer of InGaN is too small, the crystallinity of the cap layer increases, and the indium (In), which is comparatively unstable and easily sublimated, tends to be removed in advance of the other components. This change in the composition renders it difficult to remove the cap layer completely and uniformly.

The non-uniformity of the cap layer removal increases as the composition ratio of less stable elements in the cap layer increases, e.g., when the preparation of indium (In) increases.

Because the well layer comprises In which is easily sublimated at the growth temperature of the cap layer, the crystal structure of the well layer is unstable. When growth rate v of the cap layer is too small, therefore, the well layer which will function as an emission layer cannot be covered by the cap layer before a portion of In in the well layer has been lost to sublimation. That is not desirable.

When growth rate v of the cap layer is too large, crystallinity and lamination of the cap layer becomes comparatively rough in a macroscopic level. As the roughness increases, it becomes difficult to remove the cap layer uniformly and simultaneously from the upper surface of the well layer (at the boundary between the cap layer and the well layer). When the cap layer removal is non-uniform, portions of the upper surface of the well layer are exposed at different rates. As a result, earlier exposed portions of the well layer are unprotected as the remainder of the cap layer is removed.

When growth rate v of the cap layer is too large the subsequent removal may be incomplete and a portion of the cap layer may remain on the upper surface of the well layer over which another barrier layer is formed. The residual portion of the cap layer will prevent the formation of a barrier layer having an excellent and uniform crystallinity.

The composition ratio x2 of indium (In) in the cap layer is preferably in a range of 0.3 to 0.5. When the composition ratio x2 is too large, the resulting cap layer compositions become unstable during subsequent thermal processing. Unstable cap layers are not preferred for forming a protective film on the well layer.

When composition ratio x2 is too small, the indium (In) present in the well layer tends to diffuse in the cap layer, another result which is not desirable.

By adjusting composition ratio x2 of indium (In) in the cap layer to be a little larger than composition ratio x1 of indium (In) of the well layer, the indium in the well layer which is unstable and easily diffused compared with other semiconductor components (In, Ga, N, and Al), can be more completely prevented from moving from the well layer to the cap layer.

According to the invention, the difference between the composition ratios x2 and x1 is preferably in a range of 0<x2−x1<0.2. When the difference x2−x1 is too large, indium (In) tends to diffuse reversibly from the cap layer to the well layer, which is not preferable.

By adjusting the growth rate of the cap layer to be more than 10 Å/min., an emission layer (a well layer) having excellent crystallinity can be obtained. The emission layer emits lights uniformly and exhibits a stable luminous output. The growth rate of the cap layer is preferably adjusted to be more than 10 Å/min. because the emission layer tends to be unstable at the temperature used to grow the cap layer, primarily due to the indium (In) present, making is preferable to cover the emission layer with the cap layer as soon as possible. These conditions are preferable for a blue-light-emitting device.

A green-light-emitting device may comprise an emission layer (a well layer) having excellent crystallinity when growth rate of the cap layer is in a range of 15 Å/min. to 30 Å/min. The emission layer emits lights uniformly and exhibits a stable luminous output. The growth rate of the cap layer is preferably more than 15 Å/min. because the emission layer tends to be unstable at the temperature used in growing the cap layer making it preferable to cover the emission layer with the cap layer as soon as possible.

When the growth rate of the cap layer is more than 30 Å/min., the growth rate of the cap layer is too fast and the cap layer tends to grow non-uniformly and produce a cap layer having comparatively non-uniform thickness and structure. When the cap layer is non-uniform, the subsequent thermal cracking (or decomposition) process cannot be carried out uniformly. Non-uniform renewal of the cap layer can result in a light-emitting device that exhibits non-uniform luminous intensity across in the emission layer and/or non-uniform luminous wavelength, which is not desirable for its luminous color.

Accordingly, the growth rate of the cap layer is preferably in a range of 15 Å/min. to 30 Å/min. This condition is especially desirable for a light-emitting device which emits green light.

A condition of growth rate of the cap layer for manufacturing a green-light-emitting device (LED, laser, etc.) is more rigorous than that for manufacturing a blue-light-emitting device (LED, laser, etc.) . This is because a well layer formed in a green-light-emitting device has a larger composition ratio of indium (In) that further decreases the stability of crystal structure.

The present invention will now be described with reference to various embodiments.

FIG. 1 is a sectional view showing the structure of a light-emitting device 10. The light-emitting device 10 using group III nitride compound semiconductor is formed on a sapphire substrate 1. On the sapphire substrate 1, an aluminum nitride (AlN) layer, having a thickness of about 25 nm, is formed as a buffer layer 2, and a silicon (Si) doped GaN layer, having a thickness of about 4.0 μm, is formed as an n-contact layer 3. The n-contact layer 3 is an n-layer with high carrier density.

An n-cladding layer 4 (a layer with low carrier concentration) made of a non-doped GaN having a thickness of about 105 Å is formed on the n-contact layer 3. An emission layer 5 having a multiple quantum well (MQW) structure is then formed on the n-cladding layer 4. About 35 Å in thickness of $In_{0.30}Ga_{0.70}N$ well layer 51 and about 70 Å in thickness of GaN barrier layer 52 are alternately laminated, and the emission layer 5 comprises 5 layers in total. A p-cladding layer 61 made of about 70 Å of magnesium (Mg) doped $Al_{0.15}Ga_{0.85}N$ of p-type conduction and p-cladding layer 62 made of about 50 nm of $Al_{0.15}Ga_{0.85}N$ of p-type conduction are then formed on the emission layer 5. A p-contact layer 7 made of about 100 nm of Mg-doped GaN of p-type conduction is then formed on the p-cladding layer 62.

An electrode 9 which transmits light is formed by a metal depositing metal on the p-contact layer 7 and an electrode 8 is formed by depositing metal on the n-contact layer 3. The electrode 9 is preferably constructed with a layer of about 40 Å cobalt (Co), which contacts to the p-contact layer 7, and a layer of about 60 Å of gold (Au), which contacts the cobalt (Co). The electrode 8 is constructed from a layer of about 200 Å vanadium (V) and a layer of about 1.8 μm in thickness of aluminum (Al) or an alloy including aluminum (Al).

Then a method for manufacturing a light-emitting device 10 is explained hereinafter.

Each of the layers of the light-emitting device 10 is formed by gaseous phase epitaxial growth, called metal organic vapor phase deposition (hereinafter MOVPE). The gases employed in this process were ammonia ($NH_3$), a carrier gas ($H_2$ or $N_2$), trimethyl gallium ($Ga(CH_3)_3$) (hereinafter TMG), trimethyl aluminum ($Al(CH_3)_3$) (hereinafter TMA), trimethyl indium ($In(CH_3)_3$) (hereinafter TMI), silane ($SiH_4$), and biscyclopentadienyl magnesium ($Mg(C_5H_5)_2$) (hereinafter $CP_2Mg$).

The single crystalline sapphire substrate 1 was placed on a susceptor in a reaction chamber for the MOVPE treatment after its main surface 'a' was cleaned by an organic washing solvent and heat treatment. Then the sapphire substrate 1 was baked at about 1100° C. under $H_2$ vapor fed into the chamber for 30 min. under normal atmospheric pressure.

About 25 nm in thickness of AlN buffer layer 2 was then formed on the surface 'a' of the baked sapphire substrate 1 under conditions controlled by lowering the temperature in the chamber to about 400° C., maintaining a relatively constant temperature, and concurrently supplying $H_2$ at a flow rate of 20 liter/min., $NH_3$ at 10 liter/min., and TMA at $1.8 \times 10^{-5}$ mol/min.

About 4.0 μm of GaN was then formed on the buffer layer 2, as an n-contact layer 3 with an electron concentration of $2 \times 10^{18}/cm^3$ and Si concentration of $4 \times 10^{18}/cm^3$, under conditions controlled by keeping the temperature of the sapphire substrate 1 at about 1150° C. and concurrently supplying $H_2$ at a flow rate of 20 liter/min., $NH_3$ at 10 liter/min., TMG at $1.7 \times 10^{-4}$ mol/min, and silane, diluted with $H_2$ gas to 0.86 ppm, at $20 \times 10^{-8}$ mol/min.

About 105 Å of non-doped GaN was then formed on the n-contact layer 3, to produce n-cladding layer 4 (with low carrier concentration), under conditions controlled by keeping the temperature of the sapphire substrate 1 at about 1150° C. and concurrently supplying $H_2$ at a flow rate of 20 liter/min., $NH_3$ at 10 liter/min., and TMG at $1.7 \times 10^{-4}$ mol/min.

Figure 2A:
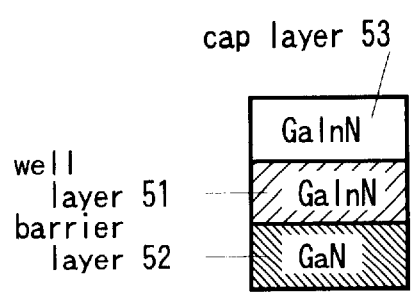
FIGS. 2A–2C are views showing a process for manufacturing the light-emitting device of the present invention.
Figure 2B:
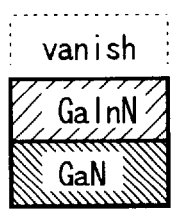
Figure 2C:
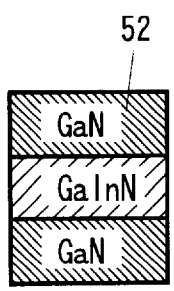

Then an emission layer 5 having a multiple quantum well (MQW) structure and comprising 5 layers in total as shown in FIG. 1 was formed on the n-cladding layer 4, using a method shown in FIGS. 2A–2C.

About 35 Å of well layer 51 comprising $In_{0.30}Ga_{0.70}N$ was formed under conditions controlled by lowering the temperature of the substrate 1 to about 730° C., and concurrently supplying $N_2$, $H_2$, and $NH_3$ at the same flow rate range, TMG at $3.1 \times 10^{-6}$ mol/min., and TMI at $0.7 \times 10^{-6}$ mol/min.

About 35 Å of cap layer 53 comprising $In_{0.40}Ga_{0.60}N$ was then formed as shown in FIG. 2A, under conditions controlled by keeping the temperature of the substrate at about 730° C. and concurrently supplying $N_2$ or $H_2$ at a flow rate of 20 liter/min., $NH_3$ at 10 liter/min., TMG at $7.7 \times 10^{-6}$ mol/min., and TMI at $1.7 \times 10^{-5}$ mol/min. Because composition ratio of indium (In) of the cap layer 53 is a little larger (by about 0.1) than that of the well layer 51, indium (In) from the well layer 51 does not tend to outflow or diffuse into the cap layer 53.

Then the temperature of the sapphire substrate 1 is raised from 730° C. to 885° C. During this process, the cap layer 53 is removed by thermal cracking (or decomposition), as shown in FIG. 2B. Because the composition ratio of indium (In) of the cap layer 53 was adjusted to be a little larger than that of the well layer 51, the indium does not tend to outflow or diffuse into the cap layer 53.

Then the formation of about 70 Å of barrier layer 52 comprising GaN was started on the well layer 51 as shown in FIG. 2C when the temperature of the substrate 1 reached about 885° C., by concurrently supplying $N_2$ or $H_2$ at a flow rate of 20 liter/min., $NH_3$ at 10 liter/min., and TMG at $1.2 \times 10^{-5}$ mol/min.

Similarly, the well layer 51 and the barrier layer 52 were alternately laminated using the method shown in FIGS. 2A–2C repeatedly. The illustrated method comprises forming a well layer 51; forming a cap layer 53 having almost the same composition as the well layer 51, while keeping the temperature of the sapphire substrate almost the same (730° C.) as the temperature at which the well layer 51 was formed and at a faster growth rate than that of the well layer 51; and raising the temperature of the substrate. As a result, an emission layer 5 comprising 5 layers (a well layer 51, a barrier layer 52, another well layer 51, a barrier layer 52, and a final well layer 51) was obtained.

After the last well layer 51 was laminated, about 35 Å of cap a layer 53 comprising $In_{0.40}Ga_{0.60}N$ is formed thereon under conditions controlled by keeping the temperature of the substrate about 730° C. and supplying the same gases at the same flow rates as those used to form the other cap layers 53. Then the temperature of the substrate was raised from 730° C. to 885° C., and the cap layers 53 are removed by a thermal cracking (or decomposition) process.

When the temperature of the substrate 1 reached 885° C., the formation of about 70 Å of Mg-doped p-type $Al_{0.15}Ga_{0.85}N$, having Mg concentration of $5\times10^{19}/cm^3$, is started on the emission layer 5 to form a p-cladding layer 61, under conditions controlled by concurrently supplying $N_2$ or $H_2$ at a flow rate of 10 liter/min., $NH_3$ at 10 liter/min., TMG at $1.0\times10^{-4}$ mol/min., TMA at $1.0\times10^{-4}$ mol/min., and $CP_2Mg$ at $2\times10^{-5}$ mol/min.

About 50 nm of Mg-doped p-type $Al_{0.15}Ga_{0.85}N$, having Mg concentration of $5\times10^{19}/cm^3$, is then formed on the p-cladding layer 61 as a p-cladding layer 62, under conditions controlled by raising the temperature of the substrate 1 to about 1100° C. and concurrently supplying $N_2$ or $H_2$ at a flow rate of 10 liter/min., $NH_3$ at 10 liter/min., TMG at $1.0\times10^{-4}$ mol/min., TMA at $1.0\times10^{-4}$ mol/min., and $CP_2Mg$ at $2\times10^{-5}$ mol/min.

About 100 nm of Mg-doped p-type GaN, having Mg concentration of $5\times10^{19}/cm^3$, is then formed on the p-cladding layer 62 as a p-contact layer 7, under conditions controlled by keeping the temperature of the substrate 1 at about 1100° C. and concurrently supplying $N_2$ or $H_2$ at a flow rate of 20 liter/min., $NH_3$ at 10 liter/min., TMG at $1.2\times10^{-4}$ mol/min., and $CP_2Mg$ at $2\times10^{-5}$ mol/min.

An etching mask is then formed on the p-contact layer 7, and predetermined portions of the mask were removed. The uncovered portions of the p-contact layer 7, the p-cladding layer 62 and 61, the emission layer 5, the n-cladding layer 4, and some part of the n-contact layer 3 and then etched using a reactive ion etching (RIE) using a chlorine containing gas to expose the surface of the n-contact layer 3.

A photoresist layer is then applied to the entire surface of the wafer including the remaining etching mask. A window is then formed on a predetermined region of the exposed surface of the n-contact layer 3 by patterning using photolithography. After establishing a high vacuum of less than about $10^{-4}$ Pa vacuum order, about 200 Å of vanadium (V) and about 1.8 $\mu m$ of aluminum (Al) were deposited on the window. The photoresist layer and the etching mask are both then removed.

A photoresist layer is then formed on the p-contact layer 7. The portion of the photoresist layer above the electrode forming part of the p-contact layer 7 is then removed by patterning using photolithography to form a window. After establishing a high vacuum of less than about $10^{-4}$ Pa, about 40 Å of cobalt (Co) and about 60 Å in thickness of gold (Au) are sequentially formed on the photoresist layer and the exposed surface of the p-contact layer 7 in a deposition reaction chamber. The substrate is then removed from the deposition reaction chamber and the cobalt (Co) and gold (Au) laminated on the photoresist layer are removed by a lift-off process leaving light-transmitting electrode 9 on the p-contact layer 7.

After the atmosphere surrounding the substrate is exhausted using a vacuum pump, $O_2$ gas is supplied until the pressure becomes 3 Pa. Under conditions controlled by keeping the pressure constant and keeping the temperature of the atmosphere about 550° C., the substrate is heated for about 3 min. Accordingly, the p-contact layer 7 and the electrode 9, and the n-contact layer 3 and the electrode 8, respectively, are alloyed.

As described above, although the cap layer 53 is removed by thermal cracking (or decomposition) during the formation of the barrier layer 52 after forming the cap layer 53 on the well layer 51, the well layer 51 is not damaged. As a result, the crystallinity of each of the well layers 51 remains high and their thickness remains uniform. Further, according to the present invention, the generation of unnecessary luminescent centers will be suppressed or prevented and luminous efficiency of the device can be improved.

Figure 3:
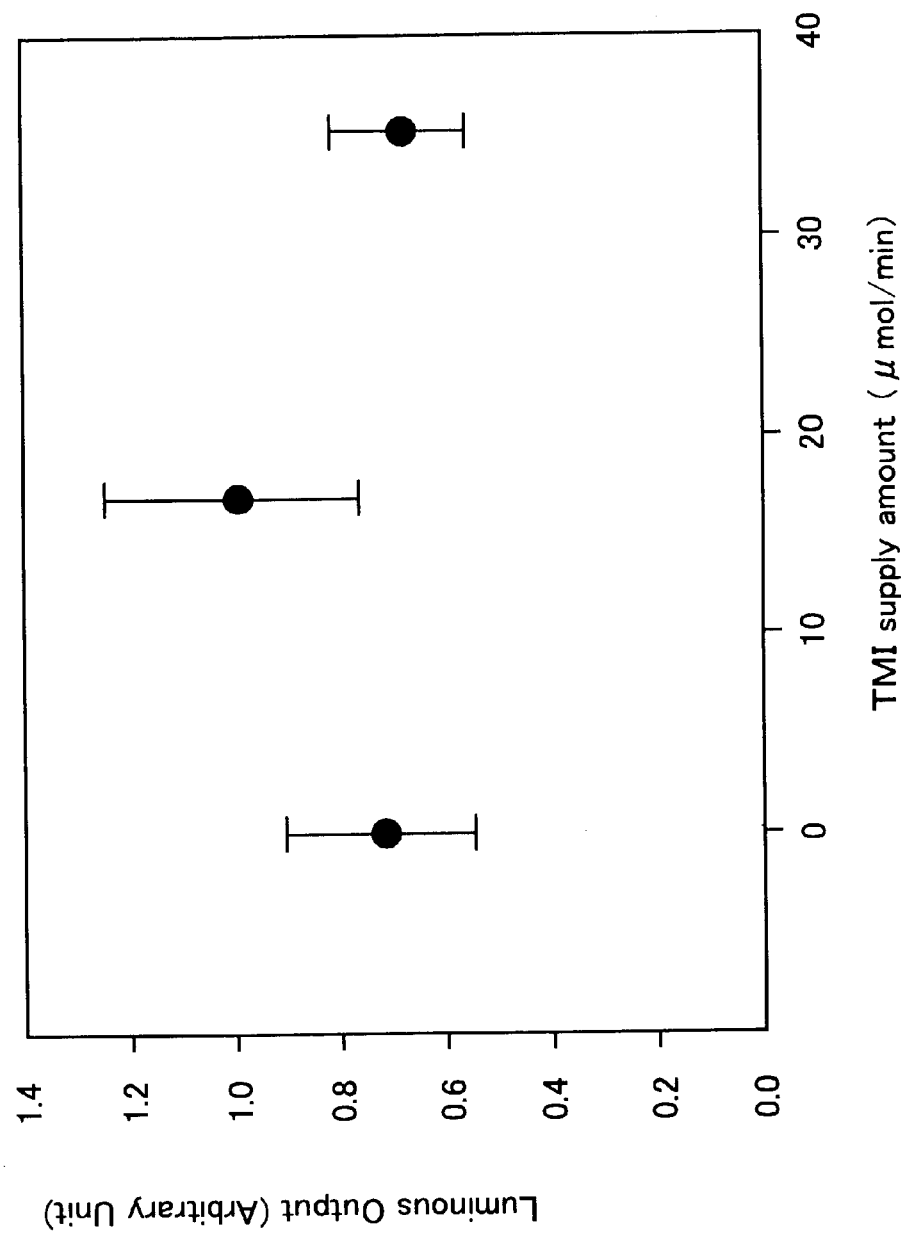
FIG. 3 is a graph showing a relationship between the amount of TMI supplied during formation of the cap layer and the luminous output of the resulting light-emitting device according to the present invention.

FIG. 3 illustrates a graph showing the relationship between the amount of TMI supplied during the formation of the cap layer on the light-emitting device (LED) 10 and its luminous output. The luminous wavelength of the light-emitting device 10 was about 470 nm. As shown in FIG. 3, when the cap layer comprises InGaN, the luminous output of the device becomes about 120% higher than that of the conventional light-emitting device (LED) which used a GaN cap layer.

But when an excessive amount of TMI is supplied during the formation of the cap layer and the composition ratio of indium (In) in the cap layer becomes excessively large, e.g., when supplying amount of TMI is almost 35 $\mu$mol/min. as shown in FIG. 3, the luminous output of the device are reduced to a level almost equal to or even smaller than that of the conventional light-emitting device. This result may be caused by the enlarged composition ratio of indium (In) rendering the structure and the cap layer deposition process unstable and producing a non-uniform removal of the cap layer during subsequent thermal processing.

Composition ratio x1 of indium (In) in the cap layer 53 formed in the light-emitting device (LED) 10 as disclosed in the above embodiment is estimated to be about 0.40 based on the amount of TMI supplied during the cap layer formation, and the luminous wavelength of the resulting light-emitting device 10, which is about 470 nm.

When a blue-light-emitting diode comprises a cap layer whose crystal growth rate is over 10 Å/min., an emission layer (well layer) of excellent crystallinity can be obtained. As a result, a preferable LED having a large luminous output and a uniform emission layer can be manufactured. More preferably, a LED having an improved luminous output can be obtained when the crystal growth rate of the cap layer is over 12 Å/min.

When a green-light-emitting diode comprises a cap layer whose crystal growth rate is 15–30 Å/min., an emission layer (well layer) of excellent crystallinity can be obtained. As a result, a preferable LED having a large luminous output and a uniform emission layer can be manufactured. More preferably, a LED having the largest luminous output can be obtained when the crystal growth rate of the cap layer is 20–25 Å/min.

In order for the cap layer in the above embodiment to be grown at a crystal growth rate of 10–30 Å/min., the formation conditions should be controlled by keeping the temperature of the substrate 1 at about 730° C. and concurrently supplying $N_2$ or $H_2$ at a flow rate of 15 to 23 liter/min., $NH_3$ at 8 to 12 liter/min., TMG at $2.6\times10^{-6}$ to $7.7\times10^{-6}$ mol/min., and TMI at $5.7\times10^{-6}$ to $1.7\times10^{-5}$ mol/min. after forming the well layer 51.

In the above embodiment, the barrier layer 52 is GaN. Alternatively, the barrier layer 52 can be formed from a binary, ternary, or quaternary group III nitride compound semiconductor represented by $Al_{(1-x1-y1)}Ga_{y1}In_{x1}N$ ($0 \leq x1 < 1$, $0 \leq y1 \leq 1$), which has a wider band gap than the well layer 51.

In the above embodiment, the cap layer 53 has a thickness which is completely and uniformly removed during the ramp-up for a subsequent thermal process. Alternatively, the cap layer 53 can be made thicker in which case, after the temperature of the substrate 1 reaches the temperature at which the barrier layer 52 is to be formed, the temperature is maintained for a period of time sufficient to remove the cap layer 53 completely and generally uniformly.

In the above embodiment, the emission layer 5 formed in the light-emitting device 10 has a multiple quantum well (MQW) structure. Alternatively, the emission layer can have a single quantum well (SQW) structure.

In the above embodiment, the cap layer 53 is formed at the temperature of about 730° C., which is same as the temperature used in forming the well layer 51. Alternatively, the cap layer can be formed at the arbitrary temperature ranging from 730° C. to 750° C.

The light-emitting device of the present invention can be applied to light-emitting devices such as LEDs and LDs, light-receiving devices, and other devices such as FETs, HEMTs, solar cells and sensors.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A method for manufacturing a light-emitting device using group III nitride group compound semiconductor having a quantum well structure, comprising steps of:
   forming a well layer;
   forming a cap layer on said well layer which has almost the same compositions as said well layer and comprises group III nitride group compound semiconductor around the temperature at which said well layer is formed and at growth rate v (>u) which is faster than crystal growth rate u of said well layer;
   eliminating a portion or all of said cap layer by using thermal cracking during a temperature raising process where the temperature is raised to a temperature for forming next group III nitride group compound semiconductor layer; and
   forming said group III nitride group compound semiconductor layer.

2. A method for manufacturing a light-emitting device using group III nitride group compound semiconductor according to claim 1, wherein said growth rate v of said cap layer is adjusted to be about 1.5 times to 5 times larger than said crystal growth rate u of said well layer.

3. A method for manufacturing a light-emitting device using group III nitride group compound semiconductor according to claim 1, wherein said well layer is formed by using $Al_{(1-x1-y1)}Ga_{y1}In_{x1}N$ ($0.05 \leq x1 \leq 0.50$, $0 \leq y1$, $x1+y1 \leq 1$).

4. A method for manufacturing a light-emitting device using group III nitride group compound semiconductor according to claim 1, wherein said well layer is formed by using $Ga_{(1-x1)}In_{x1}N$ ($0.05 \leq x1 \leq 0.50$).

5. A method for manufacturing a light-emitting device using group III nitride group compound semiconductor according to claim 1, wherein said cap layer is formed by using $Al_{(1-x2-y2)}Ga_{y2}In_{x2}N$ ($0.07 \leq x2 \leq 0.60$, $0 \leq y2$, $x2+y2 \leq 1$).

6. A method for manufacturing a light-emitting device using group III nitride group compound semiconductor according to claim 1, wherein said cap layer is formed by using $Ga_{(1-x2)}In_{x2}N$ ($0.07 \leq x2 \leq 0.60$).

7. A method for manufacturing a light-emitting device using group III nitride group compound semiconductor according to claim 1, wherein indium composition ratio x2 of said cap layer is larger than indium composition ratio x1 of said well layer.

8. A method for manufacturing a light-emitting device using group III nitride group compound semiconductor according to claim 1, wherein said cap layer has a porous structure in which atomic vacancy is scattered.

9. A method for manufacturing a light-emitting device using group III nitride group compound semiconductor according to claim 1, wherein said cap layer has a thickness which is completed to be eliminated till said next layer of said group III nitride group compound semiconductor is started to be formed.

10. A method for manufacturing a light-emitting device using group III nitride group compound semiconductor according to claim 1, wherein growth rate v of said cap layer is more than 10 Å/min.

11. A method for manufacturing a light-emitting device using group III nitride group compound semiconductor according to claim 1, wherein said growth rate v of said cap layer is in a range of 15 Å/min. to 30 Å/min.

12. A method for manufacturing a light-emitting device using group III nitride group compound semiconductor according to claim 2, wherein said well layer is formed by using $Al_{(1-x1-y1)}Ga_{y1}In_{x1}N$ ($0.05 \leq x1 \leq 0.50$, $0 \leq y1$, $x1+y1 \leq 1$).

13. A method for manufacturing a light-emitting device using group III nitride group compound semiconductor according to claim 2, wherein said well layer is formed by using $Ga_{(1-x1)}In_{x1}N$ ($0.05 \leq x1 \leq 0.50$).

14. A method for manufacturing a light-emitting device using group III nitride group compound semiconductor according to claim 2, wherein said cap layer is formed by using $Al_{(1-x2-y2)}Ga_{y2}In_{x2}N$ ($0.07 \leq x2 \leq 0.60$, $0 \leq y2$, $x2+y2 \leq 1$).

15. A method for manufacturing a light-emitting device using group III nitride group compound semiconductor according to claim 3, wherein said cap layer is formed by using $Al_{(1-x2-y2)}Ga_{y2}In_{x2}N$ ($0.07 \leq x2 \leq 0.60$, $0 \leq y2$, $x2+y2 \leq 1$).

16. A method for manufacturing a light-emitting device using group III nitride group compound semiconductor according to claim 4, wherein said cap layer is formed by using $Al_{(1-x2-y2)}Ga_{y2}In_{x2}N$ ($0.07 \leq x2 \leq 0.60$, $0 \leq y2$, $x2+y2 \leq 1$).

17. A method for manufacturing a light-emitting device using group III nitride group compound semiconductor according to claim 2, wherein said cap layer is formed by using $Ga_{(1-x2)}In_{x2}N$ ($0.07 \leq x2 \leq 0.60$).

18. A method for manufacturing a light-emitting device using group III nitride group compound semiconductor according to claim 3, wherein said cap layer is formed by using $Ga_{(1-x2)}In_{x2}N$ ($0.07 \leq x2 \leq 0.60$).

19. A method for manufacturing a light-emitting device using group III nitride group compound semiconductor according to claim 4, wherein said cap layer is formed by using $Ga_{(1-x2)}In_{x2}N$ ($0.07 \leq x2 \leq 0.60$).

20. A method for manufacturing a light-emitting device using group III nitride group compound semiconductor according to claim 5, wherein said cap layer is formed by using $Ga_{(1-x2)}In_{x2}N$ ($0.07 \leq x2 \leq 0.60$).

21. A method for manufacturing a light-emitting device using group III nitride group compound semiconductor according to claim 2, wherein indium composition ratio x2 of said cap layer is larger than indium composition ratio x1 of said well layer.

22. A method for manufacturing a light-emitting device using group III nitride group compound semiconductor according to claim 3, wherein indium composition ratio x2 of said cap layer is larger than indium composition ratio x1 of said well layer.

23. A method for manufacturing a light-emitting device using group III nitride group compound semiconductor according to claim 4, wherein indium composition ratio x2 of said cap layer is larger than indium composition ratio x1 of said well layer.

24. A method for manufacturing a light-emitting device using group III nitride group compound semiconductor according to claim 5, wherein indium composition ratio x2 of said cap layer is larger than indium composition ratio x1 of said well layer.

25. A method for manufacturing a light-emitting device using group III nitride group compound semiconductor according to claim 6, wherein indium composition ratio x2 of said cap layer is larger than indium composition ratio x1 of said well layer.

26. A method for manufacturing a light-emitting device using group III nitride group compound semiconductor according to claim 2, wherein said cap layer has a porous structure in which atomic vacancy is scattered.

27. A method for manufacturing a light-emitting device using group III nitride group compound semiconductor according to claim 2, wherein said cap layer has a thickness which is completed to be eliminated till said next well layer of forming said group III nitride group compound semiconductor is started to be formed.

28. A method for manufacturing a light-emitting device using group III nitride group compound semiconductor according to claim 7, wherein said cap layer has a thickness which is completed to be eliminated till said next well layer of forming said group III nitride group compound semiconductor is started to be formed.

29. A method for manufacturing a light-emitting device using group III nitride group compound semiconductor according to claim 2, wherein growth rate v of said cap layer is more than 10 Å/min.

30. A method for manufacturing a light-emitting device using group III nitride group compound semiconductor according to claim 7, wherein growth rate v of said cap layer is more than 10 Å/min.

31. A method for manufacturing a light-emitting device using group III nitride group compound semiconductor according to claim 2, wherein said growth rate v of said cap layer is in a range of 15 Å/min. to 30 Å/min.

32. A method for manufacturing a light-emitting device using group III nitride group compound semiconductor according to claim 4, wherein said growth rate v of said cap layer is in a range of 15 Å/min. to 30 Å/min.

33. A method for manufacturing a light-emitting device using group III nitride group compound semiconductor according to claim 6, wherein said growth rate v of said cap layer is in a range of 15 Å/min. to 30 Å/min.

34. A method for manufacturing a light-emitting device using group III nitride group compound semiconductor according to claim 7, wherein said growth rate v of said cap layer is in a range of 15 Å/min. to 30 Å/min.

35. A method for manufacturing a light-emitting device using group III nitride group compound semiconductor according to claim 9, wherein said growth rate v of said cap layer is in a range of 15 Å/min. to 30 Å/min.

36. A method for manufacturing a light-emitting device using group III nitride compound semiconductors having a quantum well structure on a substrate, comprising steps of:

forming a well layer at a first crystal growth rate and at a first deposition temperature, the well layer comprising a first group III nitride compound semiconductor layer;

forming a cap layer on said well layer at a second crystal growth rate and at a second deposition temperature, the cap layer comprising a second group III nitride compound semiconductor layer;

wherein the difference between the first deposition temperature and the second deposition temperature is less than 50° C., and further wherein the second crystal growth rate is faster than the first crystal growth rate;

increasing the temperature of the substrate, the well layer and the cap layer from an initial temperature to a third deposition temperature, the third deposition temperature being greater than the second deposition temperature;

removing at least a portion of the cap layer by decomposition as the temperature of the cap layer increases from the initial temperature to the third deposition temperature; and forming a third group III nitride compound semiconductor layer at the third deposition temperature.

37. A method for manufacturing a light-emitting device using group III nitride compound semiconductors according to claim 36, wherein the difference between the first deposition temperature and the second deposition temperature is less than 15° C.

* * * * *